United States Patent [19]

Aling

[11] 4,096,411
[45] Jun. 20, 1978

[54] GAS DISCHARGE TUBE AND MEANS FOR MAINTAINING AN INVISIBLE GAS DISCHARGE THEREIN

[75] Inventor: Willem Aling, Eindhoven, Netherlands

[73] Assignee: U.S. Philips Corporation, New York, N.Y.

[21] Appl. No.: 742,342

[22] Filed: Nov. 16, 1976

[30] Foreign Application Priority Data

Nov. 21, 1975 Netherlands ........................ 7513608

[51] Int. Cl.$^2$ ..................... H05B 37/02; H05B 41/392
[52] U.S. Cl. ................................. 315/158; 315/169 R
[58] Field of Search ........... 315/169 TV, 84.6, 169 R, 315/156, 158, 154, 167

[56] References Cited

U.S. PATENT DOCUMENTS 3,600,631   8/1971   Cake .................................. 315/169 R
3,737,803   6/1973   Kojima et al. .................... 315/158 X
3,875,527   4/1975   Garcia ............................... 315/158 X

OTHER PUBLICATIONS

Electron Design, vol. 11, May 24, 1976, p. 98, Michael A. Molack, "Photoresistor provides automatic dimming of electronic display systems".

*Primary Examiner*—Davis L. Willis
*Assistant Examiner*—Charles F. Roberts
*Attorney, Agent, or Firm*—Frank R. Trifari; Bernard Franzblau

[57] ABSTRACT

A gas discharge display tube is supplied with a small DC current at a level to maintain an invisible gas discharge and with a pulse-shaped supply voltage having a controllable pulse duration whereby a stable discharge is obtained at a very low brilliance level and voltage transients are substantially eliminated.

13 Claims, 1 Drawing Figure

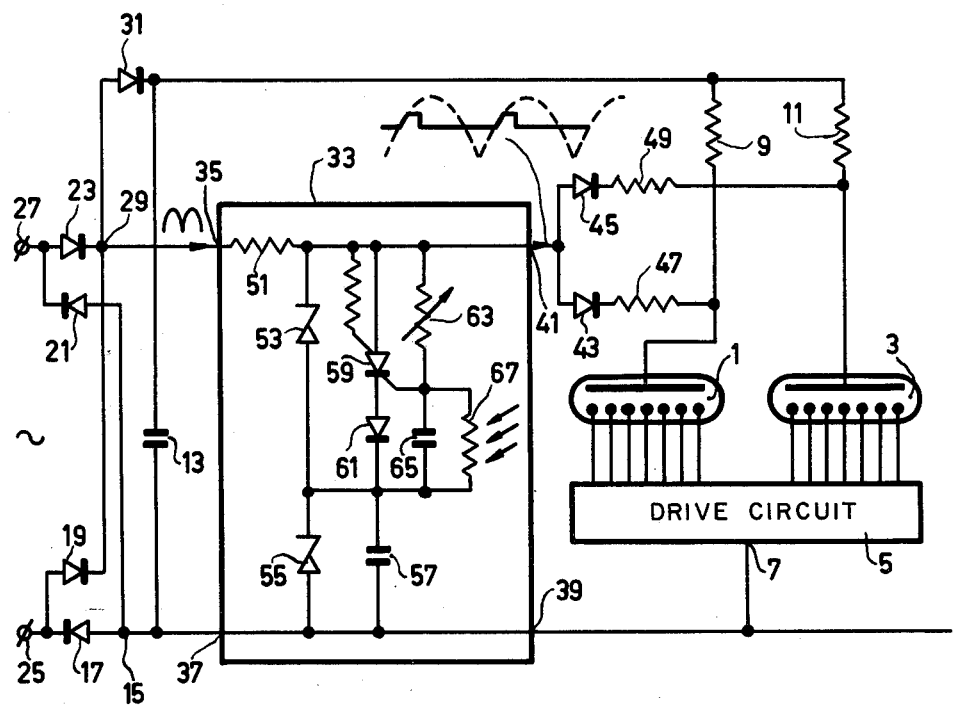

GAS DISCHARGE TUBE AND MEANS FOR MAINTAINING AN INVISIBLE GAS DISCHARGE THEREIN

The invention relates to a gas discharge display system comprising a gas discharge display tube having at least one anode coupled to a d.c. voltage supply and a plurality of cathodes which are coupled to a drive circuit and which are situated opposite that anode.

Philips Application Information 327 (published 9/30/68 by Philips Electronic Components & Materials Division) pages 21–22 discloses gas discharge display systems of the above-mentioned kind. Feeding a d.c. voltage to the anode of a display tube is in general employment with display circuits having a small number of display positions such as, for example, are used for clocks or for channel indications of television receivers. If these systems are to be used in both poorly and well-illuminated places, it must be possible to adapt the brilliance of the display to its environment. However, with a low brilliance of the display the cathode currents become so small that the gas discharges cannot properly cover the cathodes so that the shape of those cathodes is no longer recognizable and consequently the display is incorrect.

It is an object of the invention to provide a gas discharge display system which provides a proper display even for a low display brilliance.

According to the invention, a gas discharge display system of the kind mentioned in the preamble is therefore characterized in that through a coupling means 43, 47 which conducts in one direction a circuit 33 is coupled to the display tube anode for supplying a pulse-shaped supply voltage with a controllable work fraction which, if a relevant cathode is driven into an on-state by the drive circuit, produces a cathode-anode voltage which exceeds the operating voltage of the relevant anode-cathode path of the display tube 1. Conversely if a relevant cathode is driven into an off-state the aforesaid pulse-shaped supply voltage produces a cathode-anode voltage which is lower than said operating voltage. At the same time the d.c. voltage supply 31, 13, 9 supplies a current to the anode of the display tube which substantially does not contribute to the display but which continuously maintains a substantially invisible gas discharge in the display tube.

This combination of means for driving the display tube with a continuously present very small direct current and a periodic drive whose duration is controllable provides a very stable display, especially with very low brilliances. At the same time only lower voltages are needed for selecting the cathodes so that for that purpose integrated circuits with low operating voltages can be used.

The invention will now be further explained with reference to the drawing which contains only one FIGURE which shows a simplified diagram of a gas discharge display system according to the invention.

The cathodes of two gas discharge display tubes 1 and 3 are connected to a drive circuit 5. The cathodes of display tubes 1 and 3 may, for example, have the shape of symbols or of segments of symbols.

The drive circuit 5 may, for example, comprise an oscillator with a plurality of divider and adder stages and a decoding circuit if the display system is part of an electric clock. This decoding circuit then drives an output circuit of the drive circuit which adjusts the voltage at those cathodes which are selected to light up to a level of 0V with respect to a terminal 7 and which adjusts the voltage at those cathodes which must not light up to a level of +30 V. The drive circuit 5 may, for example, be of the type S 1998 supplied by American Microsystems Inc. or MM 5316 supplied by National Semiconductor Corporation.

The anodes of the display tubes 1, 3 are connected through a resistor 9 or 11 to a terminal of a smoothing capacitor 13 whose other terminal is connected to terminal 7 of the control circuit 5. A d.c. voltage of approximately 310 V is produced across the smoothing capacitor 13 as will be further explained hereinafter. The resistors 9 and 11 are chosen to carry a voltage such that, owing to this d.c. voltage, a very small current invariably flows to the display tubes 1 and 3 which produces a substantially invisible gas discharge. Consequently the control circuit 5 need not supply a starting voltage.

The smoothing capacitor 13 and the terminal 7 of the control circuit 5 are connected to an output terminal 15 of an unfiltered rectifier circuit composed of four diodes 17, 19, 21 and 23 which are fed by an a.c. voltage of, for example, 220 V 50 Hz which can be obtained directly from terminals 25, 27 of a house supply. Another output terminal 29 of the four-diode circuit is conncted to the other terminal of the capacitor 13 through a diode 31.

Across the terminals 15 and 29 of the four-diode rectifier circuit there is an unfiltered double-full wave rectified a.c. voltage which consists of half sinusoids of the same polarity which occur at a frequency of 100 Hz and which have a peak value of approximately 310 V. The diode 31 and the smoothing capacitor 13 convert this voltage into the above-mentioned d.c. voltage of approximately 310 V.

The voltage across the terminals 15 and 29 is furthermore supplied to the inputs of a circuit 33 which converts this voltage into a pulse-shaped voltage having a pulse duration which has a controllable work fraction, in which the term work fraction must be understood to mean that part of a cycle that the voltage for the display in the tubes 1 and 3 can be operative. The circuit 33 consequently serves as a pulse-shaper and has two output terminals 39 and 41 across which the pulse-shaped voltage is produced. On the one hand the terminal 41 is connected through a unilaterally conducting coupling means composed of a diode 43 or 45 and a resistor 47 or 49 respectively to the anode of the display tube 1 or 3. On the other hand the terminal 39 is connected to terminal 7 of the control circuit 5.

So the pulse-shaper circuit 33 supplies to the display tubes 1 or 3 a voltage which each time can only be operative during part a of the cycling time of the current at the input 35, 37. Consequently, a voltage starts flowing through the display tubes 1, 3 to those cathodes which are at 0 V. The latter light up with a brilliance which depends on said work fraction and which can be controlled by adjusting this work fraction. For a very low brilliance condition the peak value of the current through the display tubes now need not be chosen very small but the work fraction is chosen to be small. Then the proper display of the symbol is not endangered.

The diodes 43, 45 ensure that if the voltage at the outputs 39, 41 of the pulse-shaper 33 becomes lower than the operating voltage, this pulse-shaper cannot affect the current through the tubes 1, 3 which, owing to the current through the resistors 9, 11 remain ignited. This means that the control circuit 5 need only be able to supply a voltage transient which exceeds the tolerance range of the operating voltages but which need not cover also the tolerance range of the starting voltages. Consequently it is possible to drive the cathodes of the display tubes, as indicated, directly from MOS circuits.

The resistors 47 and 49 enable the pulse-shaper 33 to drive a plurality of tubes having different operating voltages, and at the same time they determine the peak value of the current through the relevant display tube.

The pulse-shaper 33 operates as follows. A series arrangement of a resistor 51 and two zener diodes 53 and 55, which is connected between the inputs 35 and 37 and to which the terminals 41, 39 are connected, ensures that the maximum output voltage at the output 39, 41 is limited to the sum of the zener voltages across the zener diodes 55 and 53. Since the operating voltages of the display tubes exhibit a tolerance range, this output voltage should at least be higher than the highest operating voltage of the display tubes in order to maintain a visible glow across the relevant anode-cathode paths. However, in order to be able to extinguish said glow, the output voltage of pulse-shaper 33, reduced by the lowest voltage at the cathodes of the display tubes (which also exhibit a certain spread) must be lower than the lowest tube operating voltage within said tolerance range.

The zener diode 55 is shunted by a capacitor 57 so that the voltage across it is a d.c. voltage of approximately 100 V. Parallel with the zener diode 53 a thyristor 59 is connected in series with a diode 61. They constitute together with the zener diode 55 a time-dependent load circuit. The starting electrode of the thyristor 59 is connected to a tap of a charging network which includes a resistor 63, a capacitor 65 and a light-dependent resistor 67. Consequently the thyristor 59 is fired each time shortly after the voltage across the zener diode 53 has become equal to its zener voltage, which causes the voltage across the zener diode 53 to substantially disappear. This time can be adjusted with the resistor 63 and depends on the quantity of ambient light owing to the light-dependent resistor 67. The voltage at the output 39, 41 of the pulse-shaper circuit now is a d.c. voltage with a pulse voltage of 100 Hz superimposed thereon. The pulse voltage has a pulse duration which can be controlled by the resistors 63 and 67.

The circuit has the additional advantage that owing to the stabilizing action of the pulse-shaper circuit 33 the brilliance of the display is substantially independent of mains voltage fluctuations.

A further advantage is that the negative resistance portion of the voltage-current characteristic of the gas discharge tubes is not passed through time and again so that few noise signals are produced. The low noise level of the circuit can be reduced still further by connecting a capacitor parallel to the zener diode 53 and a resistor in series with the anode of the thyristor 59. It may then occur that the voltage across the points 29 and 15 does not become sufficiently low anymore during the zero crossings of the supply voltage in which case a resistor may be applied between the points 29 and 15.

If the gas discharge tubes show few tolerances the resistors 47, 49 which are in series with the diodes 43, 45 may be very small or may even be dispensed with.

The drive circuit 5 may, for example, be supplied by means of the d.c. voltage across the capacitor 57.

It will be obvious that it is also possible to proceed from a smoothed d.c. voltage at the input 35, 37 of the pulse-shaper circuit if the pulse-shaper circuit, which must then be slightly altered, is driven by a pulse generator which can determine the work fraction.

The zener diode 53 can be dispensed with if the voltage owing to load variations can not rise too high.

If so desired one or a plurality of multiple display tubes can be used or only one single display tube. If a multiple display tube having more than one anode is used it often suffices to feed a direct current to one of the anodes through a resistor, for example, the resistor 9. Then the other anodes need not receive a direct current.

If a dependency on the ambient light is not desired the resistor 67 can be dispensed with.

The resistor 63 may be replaced by a transistor which is connected as an adjustable voltage source.

What is claimed is:

1. A gas discharge display system comprising, a gas discharge display tube having at least one anode and a plurality of cathodes which are situated opposite said anode and are coupled to a drive circuit, a circuit for supplying a pulse-shaped supply voltage having a controllable work fraction, a uni-directional conductive coupling means coupling the tube anode to said circuit for supplying a pulse-shaped supply voltage with a controllable work fraction so that if a relevant cathode is driven to an on-state by the drive circuit a cathode-anode voltage is produced which exceeds the operating voltage of the relevant anode-cathode path of the display tube and if a relevant cathode is driven to an off-state a cathode-anode voltage is produced which is lower than said operating voltage, and means for coupling a d.c. voltage supply to the display tube anode so that the d.c. voltage supply supplies a continuous d.c. current to said anode at a level which substantially does not contribute to the tube display but which continuously maintains a substantially invisible gas discharge in the display tube.

2. A gas discharge display system as claimed in claim 1 wherein said pulse-shaped voltage supply circuit includes a light-dependent resistor which reacts to ambient light to control the work fraction.

3. A gas discharge display system as claimed in claim 1 further comprising an unfiltered four-diode rectifier circuit connected to a pair of AC supply terminals, and said d.c. voltage supply includes a smoothing capacitor connected to the output of the rectifier circuit through a diode for supplying the direct current to the tube anode and the pulse-shaped supply voltage circuit includes a pulse-shaper circuit which is coupled to the output of the four-diode rectifier circuit.

4. A gas discharge display system as claimed in claim 3, characterized in that the pulse-shaper circuit comprises a series arrangement of a resistor and a time-dependent charging circuit.

5. A gas discharge display system as claimed in claim 4, characterized in that the time-dependent charging circuit includes a series arrangement of a thyristor circuit and a zener diode.

6. A gas discharge display system as claimed in claim 5, characterized in that a further zener diode is connected parallel to the thyristor circuit.

7. A gas discharge display system as claimed in claim 6, characterized in that the thyristor circuit comprises a series resistor and a parallel capacitor.

8. A gas discharge display system comprising, a gas discharge display tube having an anode and a plurality of cathodes coupled to a drive circuit for selectively applying first and second voltage levels to the cathodes, means for supplying a pulse-shaped voltage having a controllable duty cycle and at a voltage level to produce a visible glow at those cathodes which are at the first voltage level but which is insufficient to produce a visible glow at the cathodes which are at the second voltage level, a first current path including a unidirectional conducting element for coupling the tube anode to the output of said pulse-shaped voltage supplying means, a direct current path exclusive of the unidirectional conducting element for coupling the tube anode to a source of DC supply voltage so that an uninterrupted DC current flows from the DC voltage source to said anode at a level insufficient to cause a visible cathode glow but able to continuously maintain a substantially invisible gas discharge in the display tube.

9. A display system as claimed in claim 8 further comprising a pair of input terminals for connection to a source of AC supply voltage, and wherein said DC voltage source includes a rectifier-capacitor circuit coupling said input terminals to said anode via the direct current coupling path, and said pulse-shaped voltage supplying means includes a circuit with its input coupled to the input terminals via diode means and its output coupled to the display tube anode via said first current path.

10. A display system as claimed in claim 9 wherein said pulse-shaped voltage supply circuit comprises a pulse-shaper circuit including a resistor and a time-dependent charge circuit connected in a series circuit to the input of the pulse-shaped voltage supply circuit.

11. A display system as claimed in claim 10 wherein the time-dependent charge circuit includes a series arrangement of a thyristor device and a zener diode.

12. A display system as claimed in claim 11 wherein said pulse-shaped voltage supply circuit further comprises a time delay circuit for coupling the trigger electrode of the thyristor device to the input of the pulse shaped voltage supply circuit.

13. A display system as claimed in claim 8 further comprising a pair of input terminals for connection to a source of AC supply voltage, and wherein said DC voltage source includes a rectifier-capacitor circuit coupled to said input terminals, and said pulse-shaped voltage supplying means includes a pulse-shaper circuit with its input coupled to said input terminals via diode means that supply a pulsating DC current to the pulse-shaper input.

* * * * *

UNITED STATES PATENT OFFICE
CERTIFICATE OF CORRECTION

Patent No. 4,096,411    Dated June 20, 1978

Inventor(s) WILLEM ALING

It is certified that error appears in the above-identified patent and that said Letters Patent are hereby corrected as shown below:

Col. 2, lines 53-54, Change "current" to --voltage --

Col. 2, line 54, After "a" change "voltage" to

-- current --

Signed and Sealed this

Thirty-first Day of March 1981

[SEAL]

Attest:

RENE D. TEGTMEYER

Attesting Officer    Acting Commissioner of Patents and Trademarks